United States Patent [19]
Woolhouse et al.

[11] 4,236,296
[45] Dec. 2, 1980

[54] ETCH METHOD OF CLEAVING SEMICONDUCTOR DIODE LASER WAFERS

[75] Inventors: Geoffrey R. Woolhouse, White Plains, N.Y.; Harold A. Huggins, Hartsdale, N.Y.; Stephen I. Anderson, Yorktown Heights, N.Y.; Frederick R. Scholl, Riverdale, N.Y.

[73] Assignee: Exxon Research & Engineering Co., Florham Park, N.J.

[21] Appl. No.: 951,074

[22] Filed: Oct. 13, 1978

[51] Int. Cl.³ .............................................. B01J 17/00
[52] U.S. Cl. .................................. 29/569L; 29/509 L; 29/580
[58] Field of Search ...................... 29/580, 583, 569 L

[56] References Cited

U.S. PATENT DOCUMENTS 3,771,219   11/1973   Tuzi .................................... 29/583

OTHER PUBLICATIONS

Electrochemical Soc. Journal, "Selective Etching of GaAs Crystals in $H_2SO_4$–$H_2O_2$$H_2O$ Systems" by Lida et al., vol. 118, pp. 768-771, 1971.

Primary Examiner—W. C. Tupman
Attorney, Agent, or Firm—D. W. Collins; P. E. Purwin

[57] ABSTRACT

Double heterostructure (Al,Ga)As wafer comprising layers of gallium arsenide and aluminum gallium arsenide on a metallized n-GaAs substrate are separated into individual devices for use as diode lasers. In contrast to prior art techniques of mechanically cleaving the wafer in mutually orthogonal directions, the wafer is first separated into bars of diodes by a process which comprises (a) forming an array of exposed lines on the n-side by photolithography to define the lasing ends of the diodes, (b) etching through the exposed metallized portion to expose portions of the underlying n-GaAs, (c) etching into the n-GaAs substrate with a V-groove etchant to a distance of about 1 to 2 mils less than the total thickness of the wafer and (d) mechanically cleaving into bars of diodes. The cleaving may be done by prior art techniques using a knife, razor blade or tweezer edge or by attaching the side of the wafer opposite to the V-grooves to a flexible adhesive tape and rolling the assembly, such as over a tool of small radius.

The diode bars may then, following passivation, be further cleaved into individual diodes by the prior art techniques of mechanically scribing and cleaving. Processing in accordance with the invention improves length definition and uniformity, increases device yields and reduces striations on lasing facets, as compared with prior art techniques.

12 Claims, 4 Drawing Figures

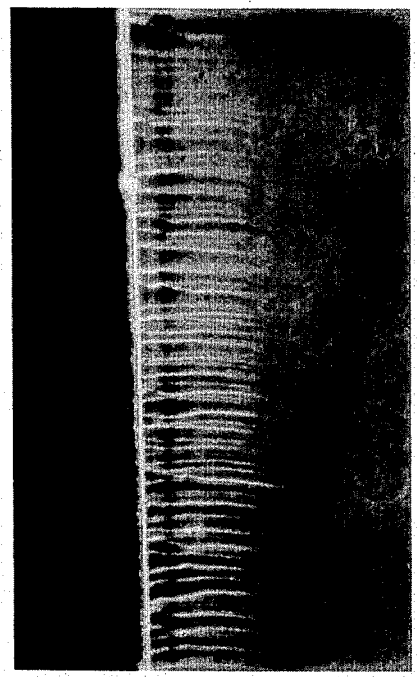 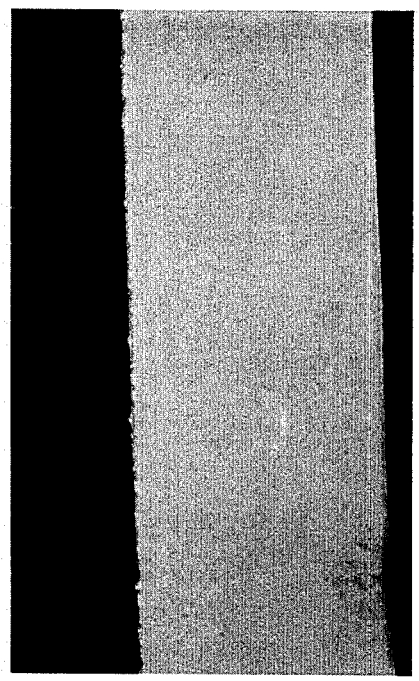
FIG. 2A  10μm  FIG. 2B

ETCH METHOD OF CLEAVING SEMICONDUCTOR DIODE LASER WAFERS

BACKGROUND OF THE INVENTION

1. Field of the Invention

The invention is related to diode lasers, and more particularly, to separating diode lasers from wafers.

2. Discussion of the Prior Art

Coherent light-emitting diodes having a GaAs-(Al,Ga)As double heterostructure, such as described in "Semiconductor Lasers and Heterojunction LED's" by H. Kressel and J. K. Butler, Academic Press, New York, 1977, are known to be efficient light sources for optical communications systems.

As is well-known, such diode lasers comprise layers of GaAs and (Al,Ga)As on an n-GaAs substrate. The final layer is a cap layer of p-GaAs. Metallized stripes, parallel to the intended direction of lasing, are deposited on the p-side of the wafer. Gold contact pads, somewhat smaller in area than the intended size of the diode laser, are deposited on the n-side of the wafer. The stripes and pads are for subsequent connection to an external electrical source.

The wafer is then cut in two mutually orthogonal directions to form the individual diodes. First, the wafer is cut perpendicular to the intended lasing facets into bars of diodes. Then the bars of diodes, following passivation of lasing facets, are cut into individual diodes.

Cutting of the wafer into bars is generally accomplished by cleaving the wafer through the substrate side, using an instrument such as a razor blade, knife, scalpel blade or the like. Control over length of the diode laser is consequently poor, and variation of diode laser length is great, with the result that longitudinal mode distribution and threshold current vary considerably from one diode laser to the next. Further, the gold contact pads must be kept thin in order to permit reasonably clean cleaving. Also, the thickness of the substrate is constrained in order to promote better cleaving. Finally, striations generated by the mechanical cleaving, if across the active lasing region, affect device yield, since such devices are consequently prone to degradation.

SUMMARY OF THE INVENTION

In accordance with the invention, a wafer comprising a semiconductor substrate, at least a portion of one surface of which is metallized, and a plurality of semiconductor layers deposited on at least a portion of the opposite surface, at least one of which layers when appropriately biased generates coherent electromagnetic radiation, is cleaved into bars of diodes by a process which comprises (a) forming an array of exposed lines on the metallized substrate by photolithography to define lasing ends of the diodes, (b) etching through the exposed metallized portion to expose portions of the underlying substrate, (c) etching into the substrate with a V-groove etchant to a depth of about 1 to 2 mils less than the total thickness of the wafer, and (d) mechanically cleaving into bars of diodes.

As a consequence of the process of the invention, good cleavage control, substantially damage-free facets along the plane of cleaving and substantially uniform definition of diode laser length are obtained. Further, cleaving in accordance with the invention increases device yield by at least 50%, as compared with prior art techniques.

BRIEF DESCRIPTION OF THE DRAWING

FIGS. 2a and 2b are photomicrographs of lasing facets of, respectively, a diode laser formed by cleaving in accordance with prior art procedures, showing striations (damage) resulting from cleavage, and a diode laser formed by cleaving in accordance with the invention, showing substantial absence of striations.

DETAILED DESCRIPTION OF THE INVENTION

The description that follows is given generally in terms of double heterostructure (DH) (Al,Ga)As diode lasers having a stripe geometry. However, it will be appreciated that other configurations and other geometries of both gallium arsenide diode lasers, as well as other semiconductor diode lasers, may also be beneficially processed following the teachings herein. Specific configurations of devices may generate coherent electromagnetic radiation in the UV, visible or IR regions.

Figure 1A:
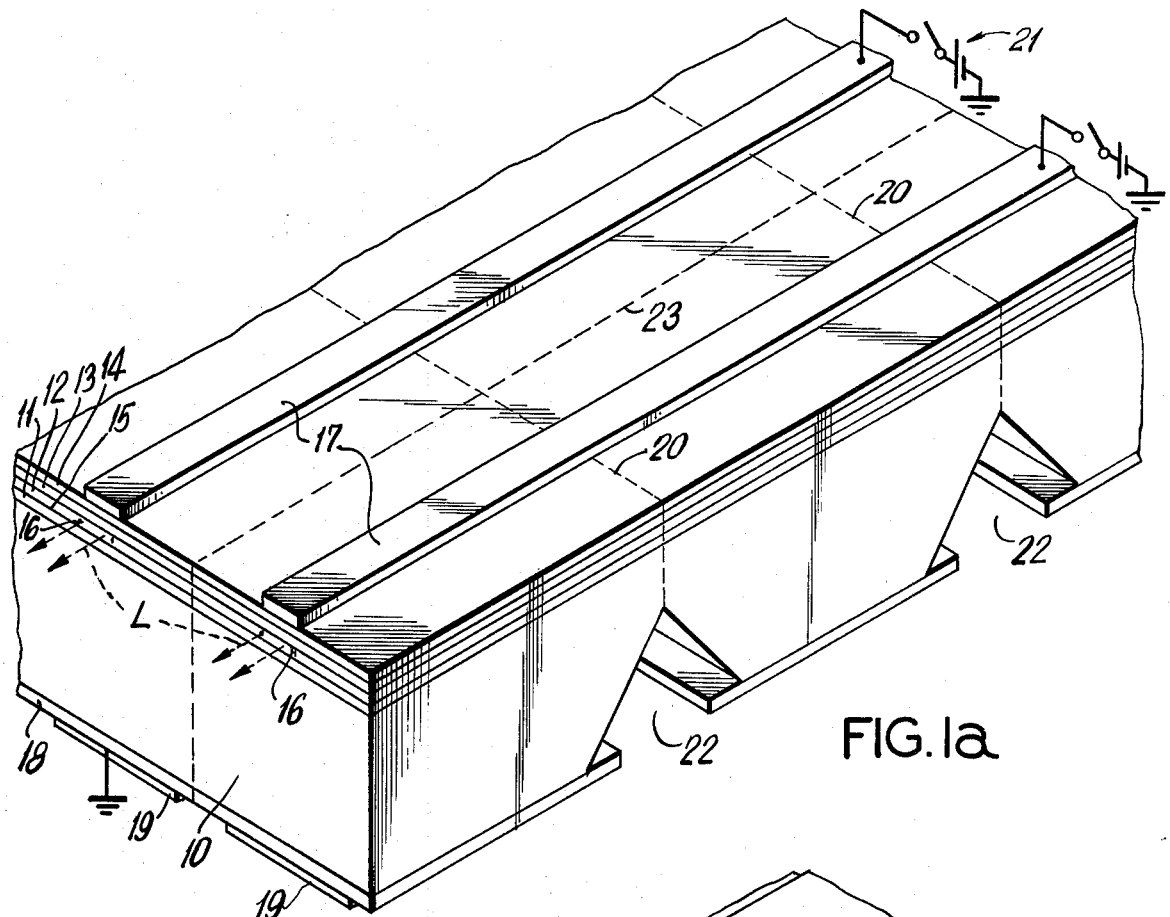
FIGS. 1a and 1b, in perspective, depict a portion of a wafer following etching of V-grooves in accordance with the invention prior to final mechanical cleaving.
Figure 1B:
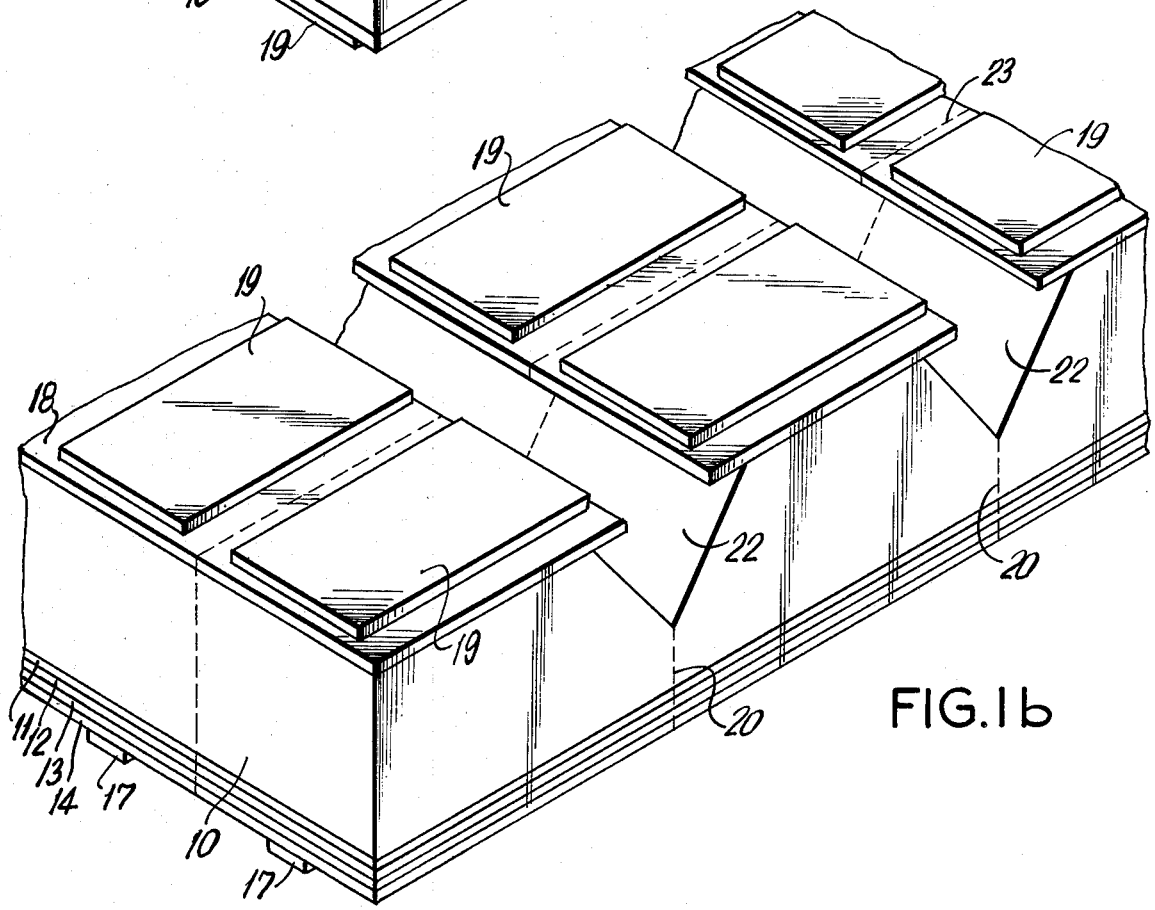

FIGS. 1a and 1b depict a portion of a wafer, considerably enlarged for purposes of illustration, from which a plurality of DH diode lasers are to be fabricated. FIG. 1a shows the wafer n-side down, while FIG. 1b shows the wafer p-side down. The wafer includes an n-type GaAs substrate 10, on at least a portion of which are normally grown four successive layers 11, 12, 13 and 14, respectively, of n-(Al,Ga)As, p-GaAs, p-(Al,Ga)As and p-GaAs. Layers 11 and 12 form a p-n junction region 15, with central areas 16 in layer 12 providing light-emitting areas. The layers are conveniently formed one over the other in one run by liquid phase epitaxy, using conventional diffusion techniques and a horizontal sliding boat apparatus containing four melts, as is well-known. Metal electrodes 17 in the form of stripes parallel to the intended direction of lasing are deposited through conventional photolithography techniques onto top layer 14 and provide means for external contact. A metal layer 18 is deposited on at least a portion of the bottom of the substrate 10. Gold pads 19, somewhat smaller in area than the intended device, are formed on layer 18, and provide means for external contact. When cleaved into individual devices, as shown by dotted lines 20, planar mirror facets are formed along (110) planes. When current above a threshold value from a battery 21 is sent through a selected electrode 17, light L is emitted from the facet on the p-n junction 16, such p-n junction lying in a plane that is perpendicular to the direction of current flow from electrode 17 to electrode 18. That is, the cavity of the laser structure is bounded by the two cleaved facets, and the laser light is emitted from the facets in a direction approximately perpendicular to the direction of current flow. The necessary reflectivity at the cavity facets is provided by the discontinuity of the index of refraction between the semiconducting materials and air.

In the typical fabrication of DH (Al,Ga)As diode lasers, the wafer comprises a substrate 10 of n-GaAs, typically about 3 to 5 mils thick and having a carrier concentration ranging from about 1 to $3 \times 10^{18}$ cm$^{-3}$, usually doped with silicon. Layers 11 and 13 of n-(Al,-Ga)As and p-(Al,Ga)As, respectively, are typically about 0.75 to 2 μm thick, with both layers having a value of x ($Al_xGa_{1-x}As$) of about 0.30 to 0.35. Layer 11 is typically doped with tin, while layer 13 is typically doped with germanium. Active layer 12, of either p-GaAs or p-(Al,Ga)As, is typically about 0.1 to 0.3 μm thick and is undoped. If layer 12 is p-(Al,Ga)As, then the value of y ($Al_yGa_{1-y}As$) ranges from about 0.05 to 0.10. Cap layer 14 of p-GaAs is typically about 0.2 to 0.5 μm thick and provides a layer to which ohmic contact may be made. The carrier concentration of layer 14, provided by germanium, is typically about 1 to $3 \times 10^{19}$ $cm^{-3}$. Metallic ohmic contacts 17 in stripe form are deposited onto layer 14 by conventional photolithographic techniques employing electroless nickel plating having a thickness ranging from about 0.05 to 0.07 μm, followed by about 1000 Å of electroplated gold. Ohmic contact 18 is formed by evaporation of, e.g., 3% silver/97% tin alloy onto the bottom of substrate 10 and typically has a thickness ranging from about 0.18 to 0.20 μm. Gold pads 19, formed by electroplating through a photoresist mask, typically are about 2 to 3 μm thick.

Following the foregoing procedure, the wafer is first cleaved into bars of diodes by cleaving the wafer through the substrate side, perpendicular to lasing facets, along lines 20, which are between gold pads 19. However, the regions covered by the gold pads are locally strained, and cleavage is unpredictable, with the consequence that prior art mechanical cleaving techniques such as a knife, razor blade or other instrument, result in diode bars of uneven length. Variations in diode laser affects longitudinal mode distribution and threshold current, with the result that these values can differ considerably for diode lasers taken from different locations on the same wafer. Further, the diode bars are subsequently placed in a fixture for evaporation of a film of $Al_2O_3$ of about 1200 Å in thickness to passivate lasing facets. If the diode bars are too long (as measured between lines 20 in FIG. 1a), then the diode bars cannot be placed in the fixture. If too short, then, due to a shadowing effect, the lasing facets are not properly passivated.

Another consequence of prior art mechanical cleaving is that the gold pads must be kept thin, as must the substrate, in order to maximize yield of diode lasers. Yet, thin gold pads are bonded to only with difficulty when connecting one end of an external lead, and thin substrates render handling of the wafer difficult. Further, such mechanical cleavage often generates striations (damage), which, when formed across the active region, can lead to increased degradation of the devices, with consequent low device yield. Such striations are shown in FIG. 2a, which is a photomicrograph of a facet cleaved in accordance with prior art techniques.

In accordance with the invention, variation in diode laser length is minimized by the following procedure. An array of exposed lines on the n-side of the wafer is formed by conventional photolithographic techniques. The lines or channels expose n-side metallized contact layer 18. The exposed portions of the metallized layer are then etched through with an etchant which selectively etches the metal without etching the semiconductor material. For example, for a contacting layer 18 of 3% Ag-97% Sn having a thickness of about 0.18 to 0.20 μm, etching is conveniently performed in about 10 minutes employing concentrated HCl. Grooves are then etched into the exposed portions of the substrate with a preferential etchant that forms V-grooves 22. Where the substrate is gallium arsenide, an example of such an etchant comprises a solution of $H_2SO_4$, $H_2O_2$ and $H_2O$. The exact details of a successful etchant for producing a V-groove 22 as shown in FIGS. 1a and 1b are described in a paper entitled "Selective Etching of Gallium Arsenide Crystals in $H_2SO_4$-$H_2O_2$$H_2O$ Systems" by S. Iida et al in Volume 118, Electrochemical Society Journal, pages 768-771 (1971) and forms no part of this invention. An example of an etchant that produces a V-groove is 1$H_2SO_4$ is a 98% solution by weight and the concentration of $H_2O_2$ is a 30% solution by weight, whereas the formula concentration is by volume. The 1-8-1 solution, at a temperature of 25° C., is able to etch through the GaAs layer at a rate of about 4 μm/min. The etchant in this concentration produces a V-shaped channel in GaAs with sidewalls having an angle of 54°44' with respect to the plane of the wafer when the etch is performed on the (001) surface along the <011> direction which gives V-grooves. The etching solution is quenched as soon as the desired amount of etching has taken place. Other etchants, whether chemical or gaseous, which also give rise to similar V-grooves, may also be employed. A relatively steep sidewall, such as 54°44', is preferred to shallower sidewalls of, say, less than 45°, in order to conserve substrate material on the etched side of the wafer.

Of course, the rate of etching can be increased by increasing the temperature of the etchant. The etchant is selective according to the crystal orientation of the material, as described above. Thus, the orientation of the wafer should be such that a V-groove configuration is obtained, rather than a round bottom configuration. The reason for this is that the bottom of the V-groove provides a precise location for initiation of cleaving, which in turn results in fabrication of individual diode lasers of precise length.

The etching is carried out to a depth of about 1 to 2 mils less than the total thickness of the wafer. If the etching is not deep enough, then cleavage is more difficult, since a cleavage plane is not well-defined and cleavage striations are more likely to occur across lasing facets, as with prior art techniques. If the etching is too deep, then cleaving is initiated beyond the substrate and in the region of the epitaxial layers, and will not result in a mirror facet.

Following etching, which, as shown in FIGS. 1a and 1b produces a V-groove 22, the wafer is mechanically cleaved by rolling or other means so as to produce cleavages along lines 20. A knife, razor blade or other sharp instrument may be used from the n-side for cleaving, resulting in diode bars of prescribed uniform length with good cleaved surfaces. Alternatively, a convenient technique is to mount the wafer, p-side up, on a flexible adhesive tape and roll the assembly over a small radius tool, such as disclosed in U.S. Pat. No. 3,497,948. Most preferred is to simply cleave from the p-side by pressing down over the V-grooves with a blunt instrument, such as a tweezer edge. This method is fast and accurate. The combination of etching V-grooves in the substrate to the specified depth range, followed by mechanical cleavage, results in substantially striation-free facets, as shown in FIG. 2b.

Following cleaving into diode bars and passivation of lasing facets, individual diodes are formed by scribing the bars, as with a diamond scribe, usually on the n-side, along lines 23 (the wafer having previously been indexed by well-known means to locate stripes 17). The scribed bars are then mechanically cleaved by rolling a tool of small radius over the bars, as is customary in the art.

The foregoing method results in good cleavage control and uniform definition of diode laser length. Consequently, longitudinal mode distribution and threshold current exhibit little variation for devices taken from different locations in the wafer. Cleavage to prescribed lengths results in easier processability for lasing facet passivation and in improved device yields. Yields improved by at least 50% are realized using the method of the invention. Cleaving through thin GaAs (from the bottom of the V-groove to the p-side) appears to reduce cleavage striations on the lasing facet, as shown in the comparison between FIGS. 2a and 2b, which are photomicrographs of cleaved facets, magnified 1100×, the former produced by a prior art method as discussed above and the latter produced in accordance with the invention. An additional benefit of the invention is that gold contact pads 19 may be made thicker without affecting the quality of the cleaved surface. Such thicker contacts permit better ease of contacting to an external power source. Also, a thicker substrate may be employed than heretofore possible, thereby increasing ease of handling.

EXAMPLE

A processed piece of GaAs material (average thickness about 4.0±0.5 mils) was divided into two pieces. One piece was held for conventional prior art cleaving, whereas the second piece was further processed for etch cleaving in accordance with the invention. The two pieces were then cleaved at the same time by the same operator using the following method for both pieces: pressing with tweezers in the direction of the desired cleave. The experiment was then repeated in the same way with another operator.

The etch cleaving was done as follows: A pattern of parallel stripes 10 μm wide and 10 mils apart (center to center) were formed by exposure of photoresist through a suitable photoresist mask. The exposed photoresist portions were removed by dissolving in developer to expose portions of a top gold layer. The exposed gold portions were removed in a KI-base gold etchant in about 1 minute at 50° C. to expose portions of an underlying 3% Ag/97% Sn layer. The exposed portions were removed using concentrated HCl for 10 minutes at room temperature to expose portions of underlying n-GaAs substrate. The exposed portions were etched with a V-groove etchant comprising $1H_2SO_4$-$8H_2O_2$-$1H_2O$ (by volume) for 15 minutes at room temperature. The etched V-grooves were formed to an average depth of about 1.5 mils less than the thickness of the wafer.

The cleavage yields were measured in terms of the number of useful bars obtained expressed as a percentage of the total amount of material. The cleavage striation densities were measured by Nomarski optical examination of 5 mm lengths of samples representative of the two methods.

The results are shown in the Table below:

|  | Prior Art Cleaving | Etch Cleaving of the Invention |
| --- | --- | --- |
| % Yield for Operator 1 | 20 | 100 |
| % Yield for Operator 2 | 10 | 100 |
| Cleavage Striation Density, $mm^{-1}$ | 300 | 6 |

It can be seen that yields were improved by a factor of 5 to 10 and cleavage striation density was reduced by a factor of 50 employing the inventive technique.

FIGS. 2a and 2b are photomicrographs of the facets cleaved by the two methods, enlarged by a factor of 1100×. The reduction in cleavage striation density afforded by the etch-cleave method of the invention is clearly visible.

What is claimed is:

1. A method of cleaving a semiconductor wafer into individual devices, said wafer comprising a substrate, at least a portion of one surface of which is metallized, and a plurality of semiconductor layers deposited on at least a portion of the opposite surface, at least one of which layers, when appropriately biased, generates coherent electromagnetic radiation, which method includes:
   (a) forming an array of exposed lines on the metallized surface of the substrate by photolithography to locate lasing ends of the devices;
   (b) etching through the exposed lines of the metallized portion to expose portions of the underlying substrate;
   (c) etching a v-groove into the substrate at the exposed portions to a depth of about 1 to 2 mils less than the thickness of the wafer; said V-groove terminating at a point before reaching the said one layer
   (d) mechanically cleaving the wafer including the said one layer along the etched V grooves to form bars of diodes, thereby generating substantially damage-free lasing facets along the plane of cleaving ,the bars of diodes being of substantially equal width;
   (e) passivating the lasing facets; and
   (f) further cleaving the bars of diodes into individual diode devices.

2. The method of claim 1 in which the semiconductor wafer comprises a substrate of gallium arsenide and layers of gallium arsenide and aluminum gallium arsenide.

3. The method of claim 2 in which the V-groove etchant comprises a solution of $H_2SO_4$, $H_2O_2$ and $H_2O$.

4. The method of claim 3 in which the etchant comprises $1H_2SO_4$-$8H_2O_2$-$1H_2O$ by volume.

5. The method of claim 1 in which the V-grooves have sidewalls at an angle of at least about 45° with respect to the plane of the wafer.

6. A method of cleaving a wafer into bars of diodes, said wafer comprising a substrate, at least a portion of which is metallized, and a plurality of semiconductor layers deposited on at least a portion of the opposite surface, at least one of which layers, when appropriately biased, generates coherent electromagnetic radiation, which method comprises:
   (a) forming an array of exposed lines on the metallized substrate by photolithography to locate lasing ends of the devices;
   (b) etching through the exposed metallized portion to expose portions of the underlying substrate;
   (c) etching a V-groove into the substrate at the exposed portions to a depth of about 1 to 2 mils less than the thickness of the wafer; said V-groove terminating at a point before reaching the said one layer and (d) mechanically cleaving the wafer including the said one layer along the etched V-grooves to form bars of diodes, thereby generating substantially damage-free lasing facets along the plane of cleaving, the bars of diodes being of substantially equal width.

7. The method of claim 6 in which the semiconductor wafer comprises a substrate of gallium arsenide and layers of gallium arsenide and aluminum gallium arsenide.

8. The method of claim 7 in which the V-groove etchant comprises a solution of $H_2SO_4$, $H_2O_2$ and $H_2O$.

9. The method of claim 8 in which the etchant comprises $1H_2SO_4$-$8H_2O_2$-$1H_2O$ by volume.

10. The method of claim 6 in which the V-grooves have sidewalls at an angle of at least about 45° with respect to the plane of the wafer.

11. The method set forth in claim 1 wherein said further cleaving of the bars of diodes into indurdual devices is substantially perpendicular to said lasing facet.

12. The method set forth in claims 5 or 10 wherein said V-grooves are etched into the <001> surface of, and in the <001> direction, of the gallium arsenide substrate.

* * * * *